US011700005B2

(12) United States Patent
Choo et al.

(10) Patent No.: US 11,700,005 B2
(45) Date of Patent: Jul. 11, 2023

(54) PHASE LOCKED LOOP GENERATING ADAPTIVE DRIVING VOLTAGE AND RELATED OPERATING METHOD

(71) Applicant: SAMSUNG ELECTRONICS CO., LTD., Suwon-si (KR)

(72) Inventors: Kangyeop Choo, Hwaseong-si (KR); Insung Kim, Hwaseong-si (KR); Wooseok Kim, Suwon-si (KR); Taeik Kim, Seongnam-si (KR); Sunghyuck Lee, Hwaseong-si (KR); Chanyoung Jeong, Hwaseong-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 9 days.

(21) Appl. No.: 17/509,540

(22) Filed: Oct. 25, 2021

(65) Prior Publication Data
US 2022/0345137 A1    Oct. 27, 2022

(30) Foreign Application Priority Data
Apr. 22, 2021   (KR) .................. 10-2021-0052528

(51) Int. Cl.
  *H03L 7/089*   (2006.01)
  *H03L 7/10*    (2006.01)
(52) U.S. Cl.
  CPC ............ *H03L 7/0891* (2013.01); *H03L 7/101* (2013.01)
(58) Field of Classification Search
  CPC ...................... H03L 7/0891; H03L 7/101
  See application file for complete search history.

(56) References Cited

U.S. PATENT DOCUMENTS

| 6,426,680    | B1  |   7/2002 | Duncan et al. |
|--------------|-----|----------|---------------|
| 6,545,634    | B1* |   4/2003 | Heide ............... H03B 23/00 342/135 |
| 9,231,519    | B2  |   1/2016 | Wei et al.    |
| 9,411,987    | B2  |   8/2016 | Alladi et al. |
| 9,954,543    | B1* |   4/2018 | Chan ................ H03L 7/099 |
| 2011/0076945 | A1  |   3/2011 | Chang et al.  |
| 2014/0210529 | A1* |   7/2014 | Sareen ............. H03L 7/0893 327/157 |

(Continued)

FOREIGN PATENT DOCUMENTS

| CN | 107820681  A * | 3/2018  | ............... H03K 5/19 |
|----|----------------|---------|---------------------------|
| EP | 4080770     A1 * | 10/2022 | ............. H03L 7/0891 |

(Continued)

OTHER PUBLICATIONS

Chen Jiahao et al: "A 92 fsrms jitter frequency synthesizer based on a multicore Class-C voltage-controlled oscillator with digital automatic amplitude control", IEICE Electronics Express, Apr. 14, 2021, pp. 1-5.

(Continued)

*Primary Examiner* — Adam D Houston
(74) *Attorney, Agent, or Firm* — Volentine, Whitt & Francos, PLLC

(57) ABSTRACT

A phased locked loop includes; a load circuit that generates an output signal in response to a driving voltage, a frequency calibration circuit that generates a calibration signal in response to an output frequency of the output signal and a target frequency, and a regulator that generates the driving voltage in response to the calibration signal.

20 Claims, 13 Drawing Sheets

(56) References Cited

U.S. PATENT DOCUMENTS

| | | | |
|---|---|---|---|
| 2014/0292301 A1 | 10/2014 | Lee et al. | |
| 2016/0164558 A1* | 6/2016 | Elzeftawi | H03L 7/099 |
| | | | 455/192.1 |
| 2020/0154374 A1 | 5/2020 | Deng et al. | |
| 2022/0345137 A1* | 10/2022 | Choo | H03L 7/0805 |

FOREIGN PATENT DOCUMENTS

| | | |
|---|---|---|
| KR | 101373205 | 3/2014 |
| KR | 20150085485 A | 7/2015 |

OTHER PUBLICATIONS

Communication dated Sep. 16, 2022 cited in corresponding EP Patent Application No. 22169340.1.

* cited by examiner

FIG. 11

| CAL | R1/R2 | DRV |
|---|---|---|
| 0 | 1 | 700mV |
| 1 | 1.007 | 705mV |
| 2 | 1.014 | 710mV |
| 3 | 1.021 | 715mV |
| 4 | 1.028 | 720mV |
| 5 | 1.035 | 725mV |
| . | . | . |
| . | . | . |
| . | . | . |
| 28 | 1.2 | 840mV |
| 29 | 1.207 | 845mV |
| 30 | 1.214 | 850mV |
| 31 | 1.221 | 855mV |

PHASE LOCKED LOOP GENERATING ADAPTIVE DRIVING VOLTAGE AND RELATED OPERATING METHOD

CROSS-REFERENCE TO RELATED APPLICATION

This application claims priority under 35 U.S.C. § 119 to Korean Patent Application No. 10-2021-0052528 filed on Apr. 22, 2021 in the Korean Intellectual Property Office, the subject matter of which is hereby incorporated by reference in its entirety.

BACKGROUND

The inventive concept relates generally to phase locked loop (PLL) circuits, and more particularly, to PLL circuits capable of generating an adaptive driving voltage.

A PLL circuit, or a clock generator including a PLL circuit, may be used to generate a phase locked clock signal, for example. Such a clock signal may be used to transmit data from a transmitter or recover data received at a receiver. PLL circuits may be implemented in a number of different configurations, such as a ring-PLL circuit, an inductor-capacitor (LC)-PLL circuit, etc.

To stably generate a clock signal in a high-speed, die-to-die (D2D) interface, it may be necessary to apply a high level voltage to at least one load circuit in a PLL circuit. For example, a PLL circuit may apply a high level voltage to stably generate a relatively high frequency (e.g., 8 to 16 GHz) in a slow process, voltage, and temperature (PVT) corner. However, when a high level voltage is applied to compensate for operation in a slow PVT corner, the power consumed by a load circuit may rapidly increase and internal elements of the load circuit may be degraded. Accordingly, certain reliability issues may arise.

SUMMARY

Embodiments of the inventive concept provide PLL circuits capable of generating stable clock signals without causing reliability issues.

According to an aspect of the inventive concept, a phase locked loop (PLL) circuit includes; a load circuit that generates an output signal in response to a driving voltage, a frequency calibration circuit that generates a calibration signal in response to an output frequency of the output signal and a target frequency, and a regulator that generates the driving voltage in response to the calibration signal.

According to an aspect of the inventive concept, a method of operating a phased locked loop (PLL) circuit includes; generating a driving voltage in a regular in response to a calibration signal, generating an output signal having an output frequency in response to the driving voltage, and generating the calibration signal by comparing the output frequency and a target frequency.

According to an aspect of the inventive concept, a phase locked loop (PLL) circuit includes; a load circuit driven by a driving voltage and generating an output signal having an output frequency, and a regulator that generates the driving voltage, wherein a level of the driving voltage varies with a calibration signal, and the calibration signal is generated by comparing the output frequency with a target frequency. The regulator may include; a first resistor having a first resistance that varies with the calibration signal, a second resistor having a second resistance, a comparator that compares a bandgap reference voltage with a feedback voltage defined according to a ratio of the first resistance and the second resistance to generate a comparison result, and a transistor activated in response to the comparison result.

BRIEF DESCRIPTION OF THE DRAWINGS

The making and use, along with related benefits and features, of the inventive concept may be better understood upon consideration of the following detailed description taken in conjunction with the accompanying drawings in which:

FIG. 11 is a table listing exemplary control signal values (e.g., a calibration signal) and corresponding driving voltages according to embodiments of the inventive concept.

DETAILED DESCRIPTION

Throughout the written description and drawings, like reference numbers and labels are used to denote like or similar elements, components and/or method steps.

Figure (FIG.) 1 is a block diagram illustrating a phase locked loop (PLL) circuit providing driving voltage(s) to load circuit(s) through respective regulator(s) according to embodiments of the inventive concept.

Figure 1:
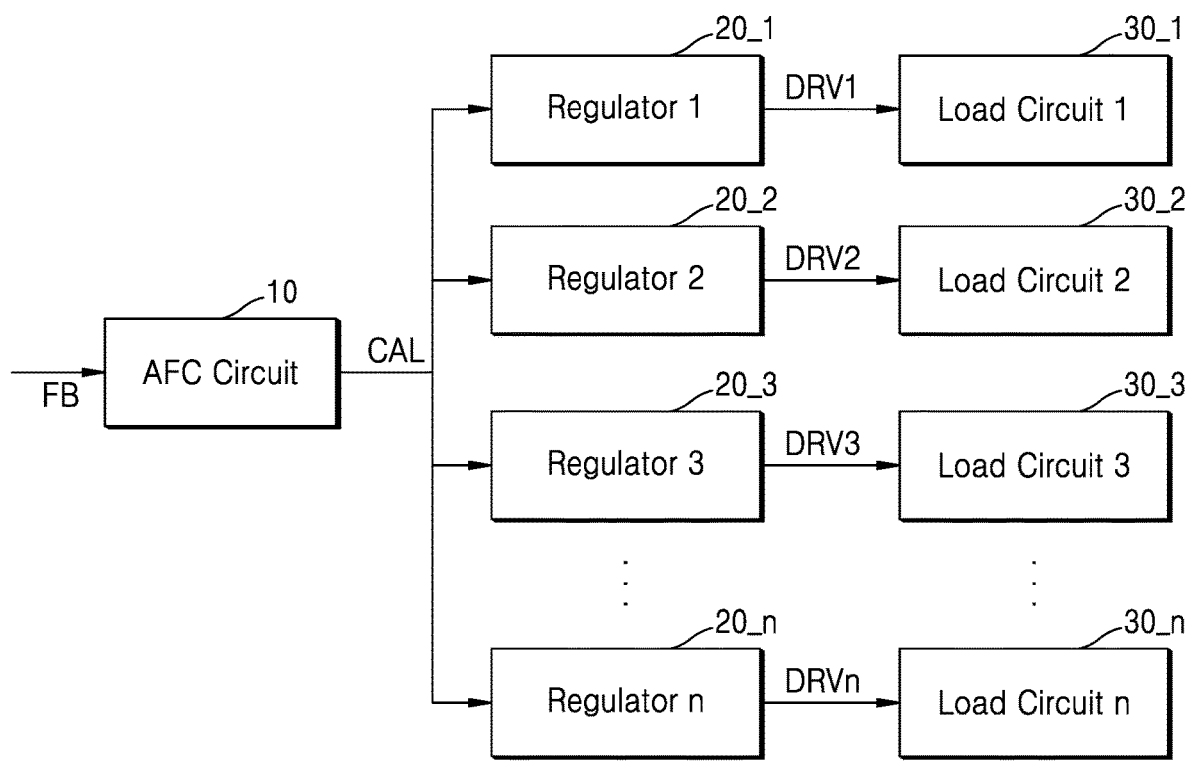
FIG. 1 is a block diagram illustrating an approach wherein a phase locked loop (PLL) circuit may provide a driving voltage to load circuit(s) according to embodiments of the inventive concept.

Referring to FIG. 1, the PLL circuit may include an automatic frequency calibration (AFC) circuit 10, regulators (e.g., 20_1 to 20_n) and load circuits (e.g., 30_1 to 30_n) respectively connected to the one of the regulators 20_1 to 20_n. The AFC circuit 10 may be used to generate a calibration signal CAL in response to a target frequency and an output frequency derived from a feedback signal FB. Here, the target frequency may be the frequency of a clock signal to-be-generated by the PPL circuit which in some embodiments may be a frequency in a range of from about 8 GHz to about 16 GHz.

The output frequency may be the frequency of a clock signal actually generated by the PLL circuit, wherein the output frequency (or a signal indicative of same) may be provided in relation to the feedback signal FB which may be fed back (e.g.,) by a divider of the PLL circuit. Here, the output frequency may vary in accordance with certain pressure, voltage and/or temperature (PVT) variables associated with the fabrication and/or operation of the PLL circuit. For example, such PVT variables may include operating conditions, operative state(s) and/or temperature(s) associated with the load circuits 30_1 to 30_n, as well as the level of a supply voltage provided to a semiconductor die. Hereinafter, a PLL circuit that operates relatively fast due to PVT variables may be referred to as a fast PVT corner (or FFHT), whereas a PLL circuit that operates relatively slow due to PVT variables may be referred to as a slow PVT corner (or SSLT).

Thus, in the illustrated example of FIG. 1, the regulators 20_1 to 20_n may receive the calibration signal CAL and provide respective driving voltages (e.g., DRV1 to DRVn) to the load circuits 30_1 to 30_n. In some embodiments, each one of the regulators 20_1 to 20_n may provide a respective driving voltage (e.g., DRV1 to DRVn) to a corresponding one of the load circuits 30_1 to 30_n using (or in relation to) a plurality of resistors.

That is, the more regulators 20_1 to 20_n may generate the driving voltages DRV1 to DRVn based on the calibration signal CAL, thereby providing the driving voltages DRV1 to DRVn corresponding to a PVT corner state to the one or more load circuits 30_1 to 30_n. For example, the regulators 20_1 to 20_n may provide the driving voltages DRV1 to DRVn corresponding to a PVT corner state to the load circuits 30_1 to 30_n by generating the driving voltages DRV1 to DRVn differently for a case wherein the calibration signal CAL indicates a slow PVT corner and/or a case wherein the calibration signal CAL indicates a fast PVT corner.

Each of the load circuits 30_1 to 30_n may include at least one driving module. When the load circuits 30_1 to 30_n include a plurality of driving modules, each respective driving module may be operated in response to the driving voltages DRV1 to DRVn generated by the corresponding one of the regulators 20_1 to 20_n. In some embodiments, each of the load circuits 30_1 to 30_n may each include an oscillator buffer, a transmission signal buffer, and a calibration block circuit.

As noted above, each one of the load circuits 30_1 to 30_n receives one of the driving voltages DRV1 to DRVn respectively generated by a corresponding one of the regulators 20_1 to 20_n. Here, different load currents may be demanded by the respective load circuits 30_1 to 30_n. So, in order to eliminate adverse effects associated with the application of the driving voltages DRV1 to DRVn to differing load circuits 30_1 to 30_n demanding different and/or varying load currents, each of the regulators 20_1 to 20_n may respectively provide one of the driving voltages DRV1 to DRVn to a corresponding one of the load circuits 30_1 to 30_n.

Figure 2:
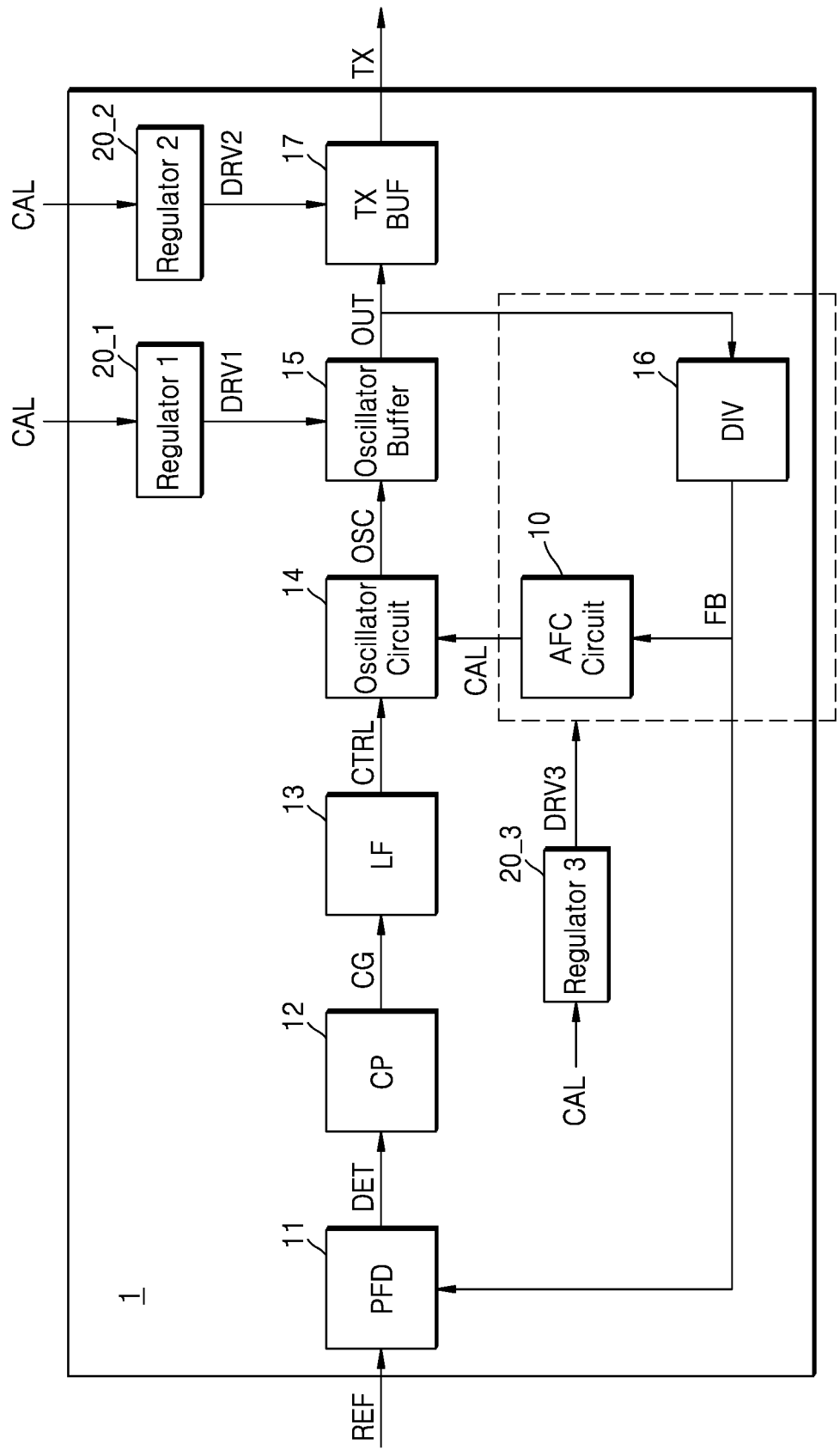
FIG. 2 is a block diagram illustrating a phase locked loop (PLL) circuit according to embodiments of the inventive concept.

FIG. 2 is a block diagram illustrating a phase locked loop (PLL) circuit 1 according to embodiments of the inventive concept.

Referring to FIG. 2, the PLL circuit 1 may include the AFC circuit 10, a phase frequency detector (PFD) 11, a charge pump (CP) 12, a loop filter (LF) 13, an oscillator circuit 14, an oscillator buffer 15, a divider 16, and a transmission signal buffer 17. In operation, the PLL circuit 1 may compare a feedback signal FB generated in response to an oscillation signal OSC generated by the oscillator circuit 14 with a reference signal REF in order to "fix" (or set) the phase of the oscillation signal OSC, thereby generating an oscillation signal OSC having a target frequency.

In some embodiments, the oscillator circuit 14 may be a voltage control oscillator (VCO) capable of generating the oscillation signal OSC having a relatively high target frequency. However, the actual frequency of the oscillation signal OSC may be significantly influenced by surrounding conditions. For example, the frequency of the oscillation signal OSC may fluctuate due to various influences (hereafter collectively referred to as "PVT variations"), such as internal circuit conditions, electrical (noise) conditions, environmental conditions, etc. Accordingly, the actual frequency of the oscillation signal OSC may deviated from the target frequency. For example, the higher the frequency of a desired output signal OUT, the greater the likely deviation in the output signal OUT may be due to PVT variations.

In this regard, the PLL circuit 1 may generate the calibration signal CAL by detecting a difference between the frequency of the output signal OUT (or a signal indicative of same) and the target frequency. The oscillator circuit 14 may then adjust the frequency of the oscillation signal OSC in response to the calibration signal CAL.

Here, the oscillator circuit 14 may be variously implemented to adjust the frequency of the oscillation signal OSC. Two example implementations will be described hereafter in some additional detail with reference to FIGS. 7A and 7B.

The divider 16 may generate the feedback signal FB from the output signal OUT according to a division ratio. That is, the divider 16 may divide the frequency of the output signal OUT by the division ratio to determine the frequency of the feedback signal FB. In some embodiments, the division ratio may be provided by a sigma delta modulator.

In some embodiments, the divider 16 may include a counter, wherein the counter may be used to generate the feedback signal FB (e.g., a signal toggling (or transitioning between two states) at the frequency (or with a period) defined according to the division ratio). Accordingly, as will be appreciated by those skilled in the art, the counter may be used to count clock cycles (e.g., a number of rising clock signal edges and/or a number of falling clock signal edges) for the output signal OUT.

In this manner, the divider 16 may provide a generated feedback signal FB to the PFD 11, wherein the PFD 11 may generate and provide a detection signal DET to the CP 12 in response to the reference signal REF and the feedback signal FB. In some embodiments, the PFD 11 may include a comparator generating the detection signal DET in relation to a phase difference between the reference signal REF and the feedback signal FB. Thus, when there is no difference between the phase of the reference signal REF and the phase of the feedback signal FB, the PFD 11 may generate a detection signal DET having a value of '0'. However, when a difference between the phase of the reference signal REF and the phase of the feedback signal FB exists, the PFD 11 may generate a detection signal DET having a pulse width corresponding to the difference in phases. In some embodiments, a "direction" (e.g., a positive or a negative charge contribution) for the detection signal DET may be defined in relation to relative levels (e.g., higher verses lower) of the reference signal REF and the phase of the feedback signal FB.

The CP 12 receives the detection signal DET from the PFD 11 and generates electrical charge signal CG in response to the detection signal DET. Thus, the CP 12 may determine the direction (e.g., positive or negative) of the charge signal CG, and may further determine a level of the charge signal CG in relation to the pulse width of the detection signal DET. For example, assuming a case wherein the detection signal DET has positive pulses, the CP 12 may provide a corresponding charge signal CG to the LF 13 having a level (e.g., an additional quantity of electrical charge) corresponding to the pulse width of the detection signal DET. Alternately, assuming a case wherein the detection signal DET has negative pulses, the CP 12 may provide a corresponding charge signal CG of the LF having a level (e.g., discharging a quantity of electrical charge) corresponding to the pulse width of the detection signal DET.

In some embodiments, the LF 13 may include a capacitor, wherein the capacitor may variably store electrical charge in relation to the applied (negative or positive) charge signal CG provided by the CP 12. In this regard, the LF 13 may generate a control voltage CTRL having a level that varies according to an amount of electrical charge stored by the capacitor of the LF 13, and provide the control voltage CTRL to the oscillator circuit 14. In some embodiments, the LF 13 may include a low pass filter implemented with DC elements to generate the control voltage CTRL, thereby reducing or eliminating noise components that might otherwise be associated with the control voltage CTRL.

In some embodiments, the oscillator circuit 14 may include an oscillator and an oscillator driving circuit, wherein the oscillator driving circuit determines the level of an oscillator driving current in response to the control voltage CTRL. That is, the oscillator driving circuit may variably apply an oscillator driving current to the oscillator, such that the oscillator generates the oscillation signal OSC at a frequency determined according to the level of the oscillator driving current. For example, assuming a positive control voltage CTRL is applied to the oscillator, the oscillator may cause the oscillation signal OSC to be generated with an increasingly higher frequency. Exemplary oscillator driving circuits will be described hereafter in some additional detail with reference to FIGS. 7A and 7B.

The oscillator buffer 15 may receive the oscillation signal OSC provided by the oscillator circuit 14, amplify the level (or magnitude) of the oscillation signal OSC while maintaining the frequency of the oscillation signal OSC in order to provide an amplified oscillation signal OSC to the transmission signal buffer 17.

Accordingly, the transmission signal buffer 17 may receive the amplified oscillation signal OSC and generate a transmission signal TX in response to the amplified oscillation signal OSC. In some embodiments, the transmission signal buffer 17 may generate a differential signal as the transmission signal TX.

In the illustrated example of FIG. 2, a first regulator 20_1 provides a first driving voltage DRV1 to the oscillator buffer 15, a second regulator 20_2 provides a second driving voltage DRV2 to the transmission signal buffer 17, and a third regulator 20_3 provides a third driving voltage DRV3 to a calibration block (shown in dotted line) performing a calibration operation. In this regard, the oscillator buffer 15, the transmission signal buffer 17 and the calibration block represent three (3) distinct load circuits potentially drawing three different load currents. Hence, the first driving voltages DRV1, the second driving voltages DRV2 and the third driving voltages DRV3 may be characterized by three independently generated levels.

Thus, referring to FIGS. 1 and 2, the oscillator buffer 15 receives the first driving voltage DRV1 from the first regulator 20_1 to generate the amplified oscillation signal OSC, the transmission signal buffer 17 receives the second driving voltage DRV2 from the second regulator 20_2 to generate the transmission signal TX, and the calibration block (including e.g., the AFC circuit 10 and the divider 16) generating the calibration signal CAL receives the third driving voltage DRV3 from the third regulator 20_3.

Figure 3:
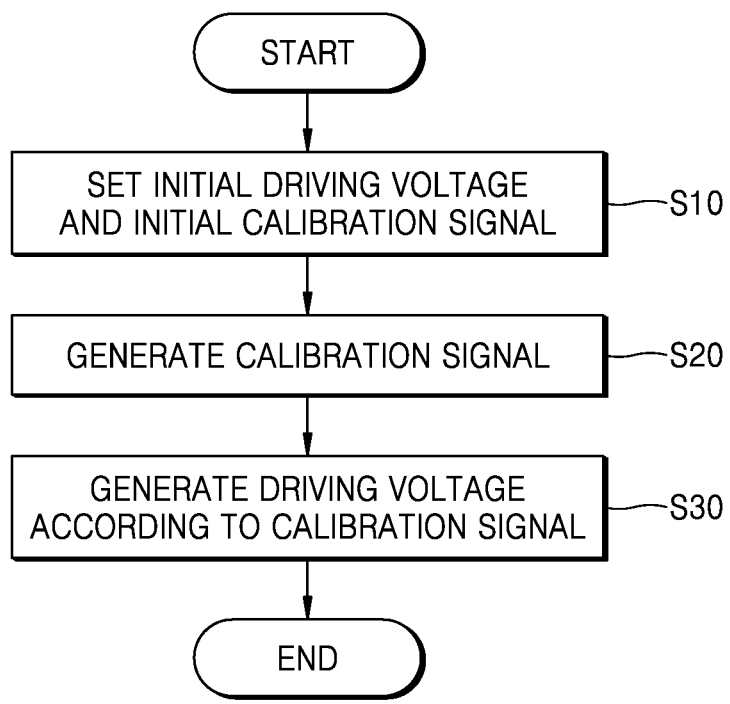
FIG. 3 is a flowchart illustrating in one example a method of operating a PLL circuit to generate a driving voltage according to embodiments of the inventive concept.

FIG. 3 is a flowchart illustrating in one example method of operating a phase locked loop (PLL) circuit that generates one or more driving voltage(s) according to embodiments of the inventive concept.

Referring to FIGS. 1, 2 and 3, the PLL circuit 1 may generate the calibration signal CAL in response to an initial driving voltage, and may thereafter adaptively generate a driving voltage in response to the calibration signal CAL. For example, the PLL circuit 1 may generate an output signal OUT by setting an initial calibration signal and the initial driving voltage (S10). The initial driving voltage may be a default driving voltage (e.g., a voltage preset before an initial operation of the PLL circuit 1). In some embodiments, the default driving voltage may be a driving voltage in which a PVT corner state is not indicated. In similar regard, the initial calibration signal may be a default calibration signal (e.g., a mean value of possible calibration signal levels).

Once the initial driving voltage and the initial calibration signal are set, the PLL circuit 1 may actively generate the calibration signal CAL by tracking the output frequency (i.e., a frequency associated with the output signal OUT) initially generated in response to the initial driving voltage and the calibration signal CAL (S20). Here, the AFC circuit 10 of the PLL circuit 1 may periodically compare an output frequency with a target frequency, and adjust the level of the calibration signal CAL in response to a corresponding comparison result. That is, the AFC circuit 10 may continuously adjust the calibration signal CAL in relation to the target frequency and a PVT corner state.

Once the calibration signal CAL is generated in relation to the target frequency, at least one of the regulators 20_1 to 20_n may receive the calibration signal CAL, and generate a driving voltage in response to the calibration signal CAL (S30). For example, the level of the driving voltage may vary in proportion to a level of the calibration signal CAL. That is, the at least one of the regulators 20_1 to 20_n may adjust the level(s) of the generated driving voltage(s) in relation to the value of a variable resistor included in the at least one of the regulators 20_1 to 20_n. In this regard, the at least one of the regulators 20_1 to 20_n may determine the level (or magnitude) of the driving voltage according to the target frequency and a PVT corner state. For example, in a slow PVT corner state, a frequency calibration circuit may generate the calibration signal CAL corresponding to a relatively higher weight, and at least one of the regulators 20_1 to 20_n may generate a relatively high level driving voltage in response to the calibration signal CAL corresponding to the higher weight. This relatively high level driving voltage may be needed by the PLL circuit 1 to properly output an oscillation signal corresponding to the target frequency in the slow PVT corner state. Alternately, in a fast PVT corner state, a relatively low level driving voltage may be needed to properly output an oscillation signal corresponding to the same target frequency as compared to the case in the slow PVT corner state.

That is, consistent with embodiments of the inventive concept, the PLL 1 should variably generate a given driving voltage with an appropriate level taking into consideration the possibility of a slow PVT corner state or a fast PVT corner state. Therefore, the PLL circuit 1 may adaptively generate a driving voltage according to a PVT corner state, thereby minimizing power consumption and efficiently generating an oscillation signal in relation to a target frequency.

Figure 4:
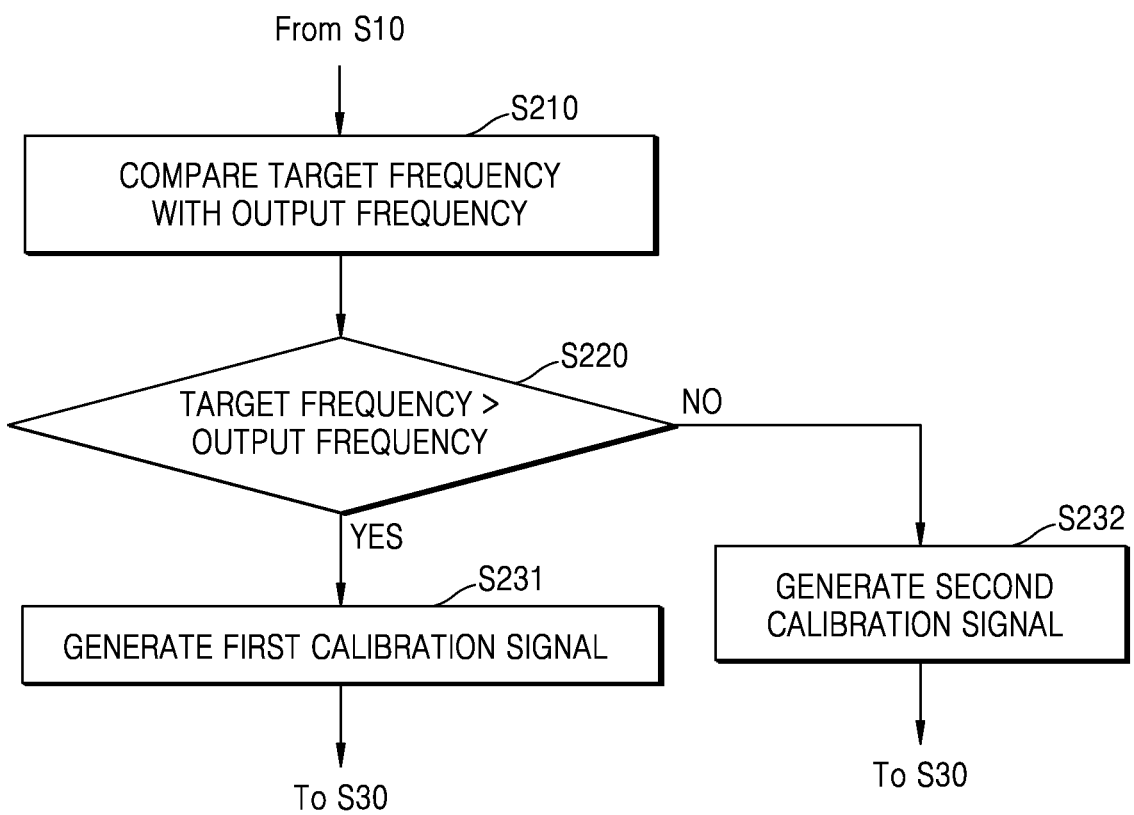
FIG. 4 is a flowchart further illustrating in one example the method step S20 of FIG. 3.

FIG. 4 is a flowchart further illustrating in one example the method step S20 ("generating calibration signal") of FIG. 3.

Referring to FIGS. 1, 2, 3 and 4, the PLL circuit 1 may update (or adjust) the calibration signal CAL by comparing the target frequency with the output frequency, and thereafter setting a driving voltage in response to the corresponding updated calibration signal CAL.

In this regard, the PLL circuit 1 may compare the target frequency with the output frequency (S210). For example, assuming that the output signal OUT provided by the oscillator buffer 15 is a digital signal, the AFC circuit 10 may be used to count a number of cycles (e.g., signal transitions between a low logic level and a high logic level) and compare the corresponding count result with a target count result corresponding to the target frequency.

Following the comparison of the target frequency and the output frequency, the AFC circuit 10 may generate either a first calibration signal (S231) or a second calibration signal (S232) in accordance with a determination of whether the target frequency is greater than the output frequency (S220). If the target frequency is greater than the output frequency (S220=YES), then the first calibration signal is generated by the AFC circuit 10, else if the target frequency is not greater than the output frequency (S220=NO), then the second calibration signal is generated by the AFC circuit 10. In this regard, each of the first and second calibration signal CAL may include at least one bit corresponding to a comparison result between the target frequency and the output frequency.

In operation S231, when the PLL circuit operates slowly or the target frequency is increased due to PVT variables, the first calibration signal CAL may be generated to increase the output frequency. Here, the PLL circuit 1 may increase (or amplify) the level of a driving voltage applied to the oscillator and the level of a driving voltage applied to a corresponding load circuit (e.g., 30_1 to 30_n) to increase the output frequency. Hence, the first calibration signal CAL may include information having a value greater than that of a previously set calibration signal CAL and, for example, may include code information including bits incremented by '1', as compared with bits of the previously set calibration signal CAL.

In operation S232, when the PLL circuit 1 operates fast or the target frequency is decreased due to PVT variables, the second calibration signal CAL may be generated to decrease the output frequency. Here, the PLL circuit 1 may decreases (or reduce) the level of a driving voltage applied to the oscillator and the level of a driving voltage apply to a corresponding load circuit (e.g., 30_1 to 30_n) to decrease the output frequency. The second calibration signal CAL may include information having a value smaller than that of a previously set calibration signal CAL and, for example, may include code information consisting of bits decremented by '1' as compared with bits of the previously set calibration signal CAL.

Referring to FIG. 4, in some embodiments, the updating (or adjusting) of the calibration signal CAL may include incrementing/decrementing bits of the calibration signal CAL in relation to bits of a previous set calibration signal CAL in accordance with comparison results between a target frequency with an output frequency. However, other approaches to the generation of the calibration signal CAL may be used in other embodiments of the inventive concept.

Figure 5:
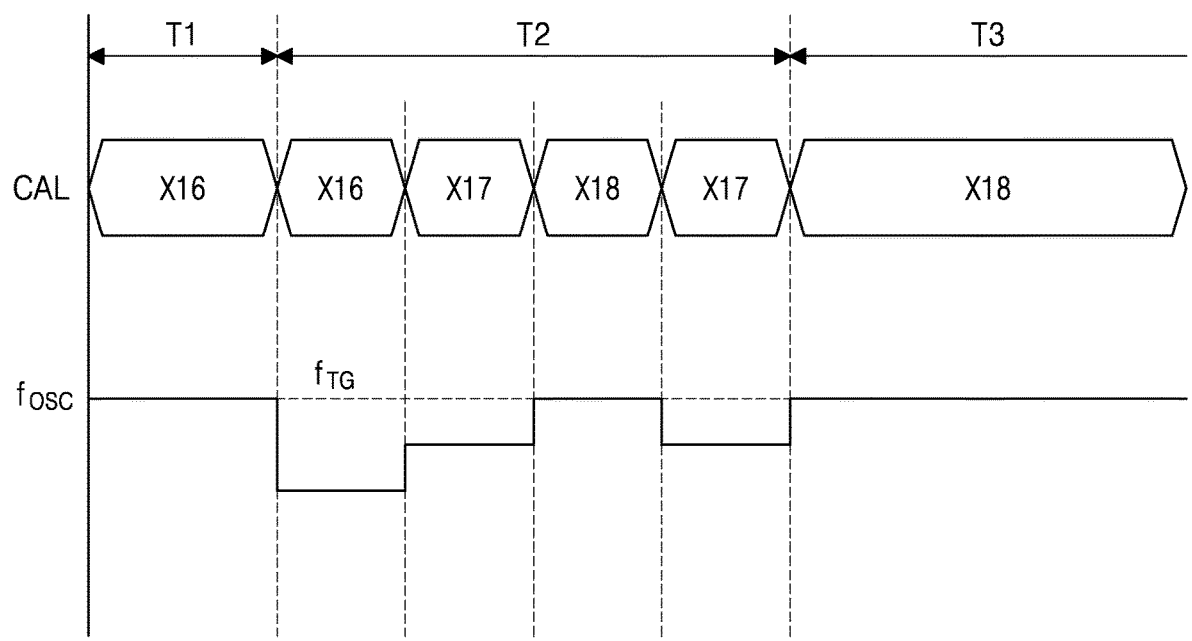
FIGS. 5 and 6 are respective timing diagrams illustrating possible relationships between a feedback signal and a calibration signal according to embodiments of the inventive concept.
Figure 6:
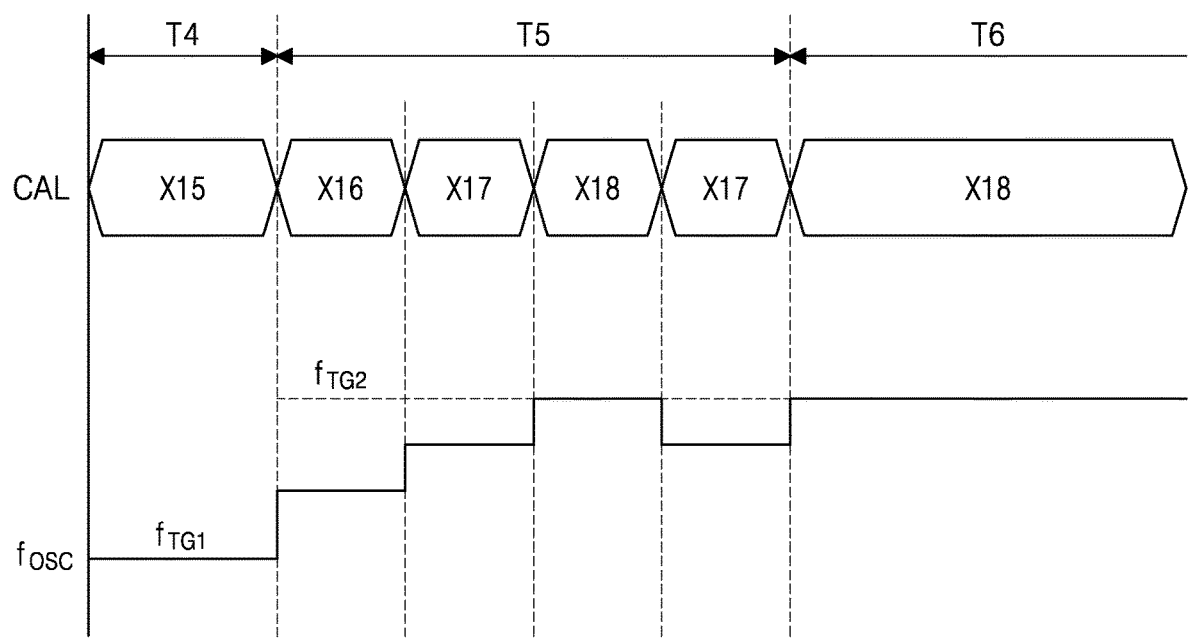

FIG. 5 is a timing diagram illustrating one example of generating an oscillation signal in response to the calibration signal CAL, and FIG. 6 is another timing diagram illustrating another example of generating the oscillation signal in response to the calibration signal CAL.

Referring to FIGS. 1, 2 and 5, as a PVT corner state is changed, an output frequency fosc decreases, and the AFC circuit 10 may update the calibration signal CAL to increase the output frequency $f_{OSC}$ back to a target frequency $f_{TG}$. During T1, the PLL circuit 1 may stably output an oscillation signal in response to the calibration signal CAL corresponding to X16, wherein the frequency of the oscillation signal may be the same as the target frequency $f_{TG}$.

During period T2, when the PVT corner state is changed, the output frequency fosc rapidly decreases even when an oscillation signal is output in response to the same calibration signal CAL of T1. Here, the AFC circuit 10 may adjust the calibration signal CAL in response to on a difference between the target frequency $f_{TG}$ and the output frequency $f_{OSC}$. As in the embodiment of FIG. 4, because the output frequency $f_{OSC}$ is lower than the target frequency $f_{TG}$, the AFC circuit 10 may generate a calibration signal CAL having a greater value than a previous calibration signal CAL. For example, as shown in FIG. 5, the AFC circuit 10 may increment bits of the calibration signal CAL in order to update the calibration signal CAL by periodically comparing the output frequency $f_{OSC}$ and the target frequency $f_{TG}$, such that the output frequency $f_{OSC}$ becomes close to the target frequency $f_{TG}$. During T2, the AFC circuit 10 may determine the calibration signal CAL by updating the calibration signal CAL, and during T3 an oscillator circuit may output an oscillation signal based on a determined calibration signal CAL.

Referring to FIGS. 1, 2 and 6 by way of comparison with FIG. 5, when a higher output frequency $f_{OSC}$ is needed as a new target frequency $f_{TG}$ is set, the AFC circuit 10 may newly update the calibration signal CAL. During T4, the PLL circuit 1 may stably output an oscillation signal based on the calibration signal CAL corresponding to X15, wherein the output frequency $f_{OSC}$ may be the same as the target frequency $f_{TG}$.

During T5, a faster clock signal may be requested by a host device or a memory device. Here, the target frequency $f_{TG}$ may be newly set to a second target frequency fTG2 having a level higher than that of a first target frequency $f_{TG1}$. The AFC circuit 10 may adjust the calibration signal CAL based on a difference between the target frequency $f_{TG}$ and the output frequency $f_{OSC}$. For example, during T5, the AFC circuit 10 may increment bits of the calibration signal CAL and may update the calibration signal CAL by periodically comparing the output frequency fosc according to the calibration signal CAL with the target frequency $f_{TG}$, such that the output frequency $f_{OSC}$ becomes close to the target frequency $f_{TG}$.

During T5, the AFC circuit 10 may determine the calibration signal CAL by continuously updating the calibration signal CAL, and during T6, the oscillator circuit may output an oscillation signal based on a determined calibration signal CAL.

From the foregoing, it may be understood that a PLL circuit according to embodiments of the inventive concept may stably output an oscillation signal corresponding to the target frequency $f_{TG}$ by updating (or adjusting) the calibration signal CAL when a PVT corner state is changed (e.g., FIG. 5) or when the target frequency $f_{TG}$ is changed (e.g., FIG. 6). That is, the calibration signal CAL may include information regarding a PVT corner state and information regarding the target frequency $f_{TG}$.

Figure 7A:
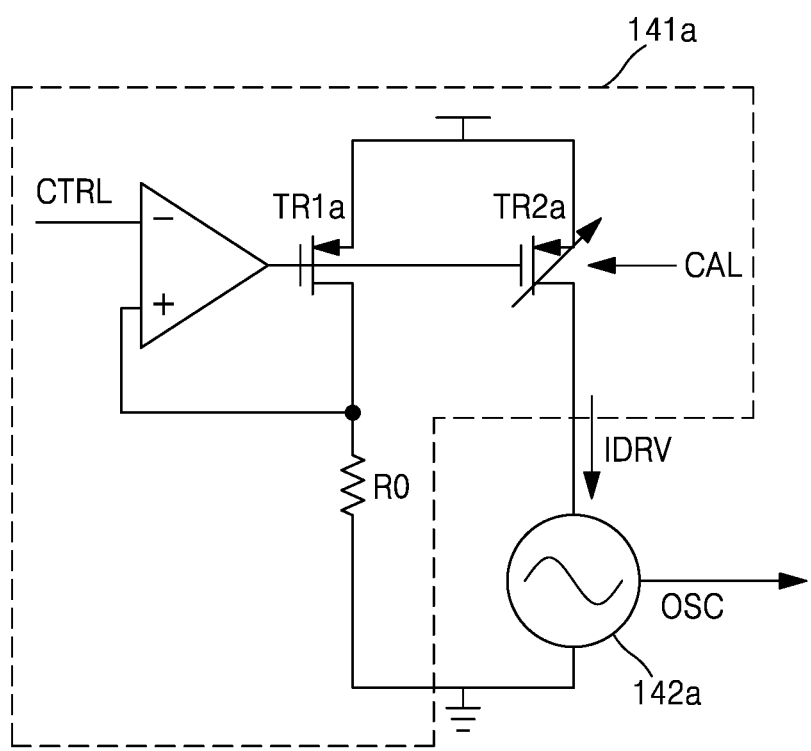
FIGS. 7A and 7B are respective circuit diagrams illustrating alternative oscillator driving circuits (14a and 14b) that may be used as the oscillator circuit 14 of FIG. 2.
Figure 7B:
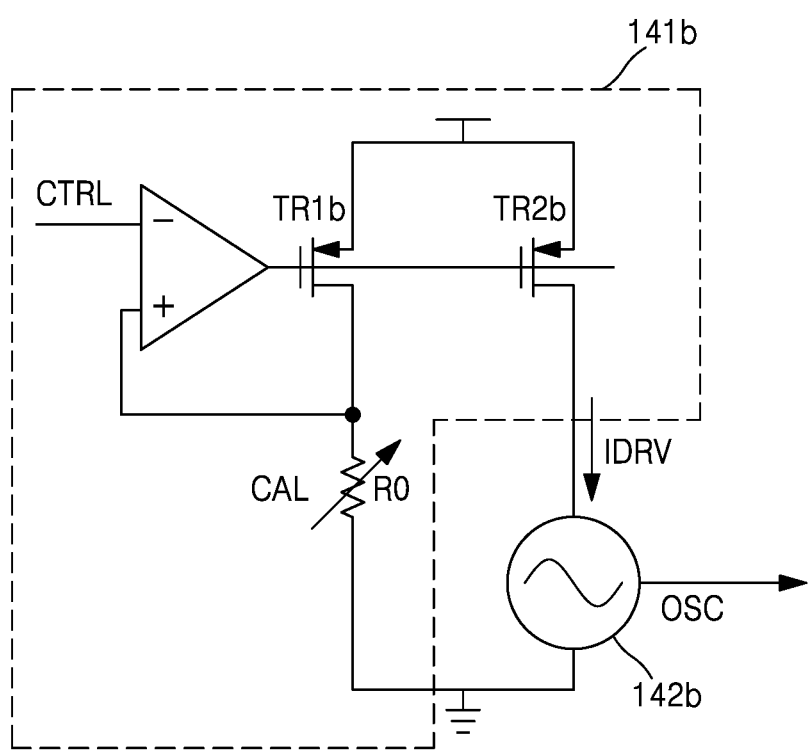

FIG. 7A is a circuit diagram illustrating an oscillator driving circuit 141a and an oscillator 142a, and FIG. 7B is a circuit diagram illustrating an oscillator driving circuit 141b and an oscillator 142b.

Referring to FIG. 7A, the oscillator driving circuit 141a may include a comparator, a current mirror circuit, and a resistor R0. The current mirror circuit may include a first transistor circuit TR1a and second transistor circuit TR2a and may output a current obtained by amplifying a current flowing in the first transistor TR1a as much as the calibration signal CAL as a driving current IDRV. The second transistor circuit TR2a may include a plurality of transistors and, for example, may determine an amplification weight by selectively turning the transistors ON/OFF in relation to code information (e.g., selected bits). The driving current IDRV generated by the oscillator driving circuit 141a may be expressed as:

$$IDRV = \frac{V_{CTRL}}{R0} \times CAL$$

Referring to FIG. 7B, the oscillator driving circuit 141b may include a comparator, a current mirror circuit, and a variable resistor R0. The resistance of the variable resistor R0 disposed between a first transistor TR1b and a ground node may vary based on the calibration signal CAL received from the AFC circuit 10. The current mirror circuit may include the first transistor TR1b and a second transistor TR2b having the same size, duplicate a current generated based on the variable resistor R0, and output a duplicated current as the driving current IDRV. The driving current IDRV generated by the oscillator driving circuit 141b may be expressed as:

$$IDRV = \frac{V_{CTRL}}{R0}$$

According to the embodiments of FIGS. 7A and 7B, the oscillators 142a and 142b, receiving the driving current IDRV, may each generate the oscillation signal OSC having a frequency proportional to the level of the driving current IDRV. Therefore, oscillator circuits 14a and 14b of FIG. 7A and FIG. 7B, receiving the calibration signal CAL, having a greater value than a previous calibration signal (e.g., FIG. 4) may each generate the oscillation signal OSC of a higher frequency.

The oscillator driving circuits 141a and 141b are not limited to only the implementation options shown in FIGS. 7A and 7B, but may include embodiments receiving the calibration signal CAL including control bits and providing different driving currents IDRV to the oscillators 142a and 142b for respective calibration signals CAL.

Figure 8:
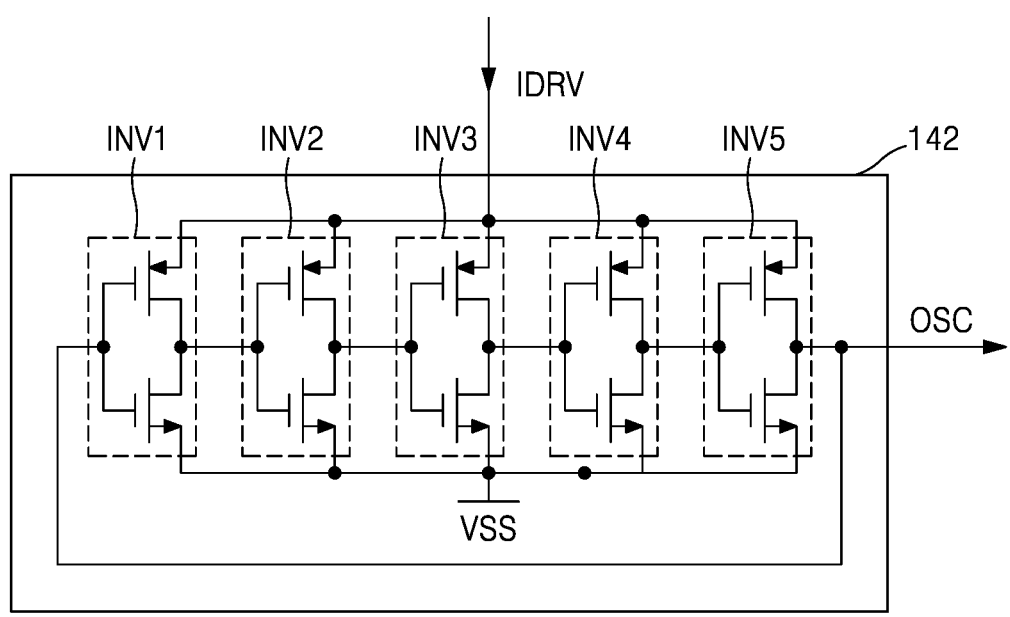
FIG. 8 is a circuit diagram illustrating a ring oscillator that may be incorporated into various embodiments of the inventive concept.

FIG. 8 is a circuit diagram illustrating in one example a ring oscillator according to embodiments of the inventive concept.

Referring to FIG. 8, an oscillator providing an oscillation signal OSC (e.g., a digital signal) may be implemented as a ring oscillator, wherein the ring oscillator includes a plurality of inverters (e.g., INV1, INV2, INV3, INV4 and INV5, hereafter collectively, "INV1 to INV5"). The inverters INV1 to INV5 may commonly receive a driving current IDRV.

Each of the inverters INV1 to INV5 may respectively provide a delay that varies according to the driving current IDRV. That is, the oscillation signal OSC may have a frequency that varies according to the driving current IDRV. Although FIG. 8 shows an example in which the ring oscillator includes five (5) inverters INV1 to INV5, those skilled in the art will appreciate that a greater or lesser number of inverters may be used.

Using the oscillator to generate the oscillation signal OSC, an oscillation signal OSC having a relatively high frequency (e.g., ranging from about 8 GHz to about 16 GHz) may be stably generated even in a slow PVT corner. However, as a relatively large amount of power is consumed under these conditions, an IR drop may increase. Therefore, as compared with the case of a fast PVT corner, it may be necessary to apply a higher driving voltage to load circuits in the slow PVT corner. According to embodiments of the inventive concept, by adaptively generating a driving voltage in relation to a particular PVT corner state, output loss due to IR drop may be efficiently compensated.

Figure 9:
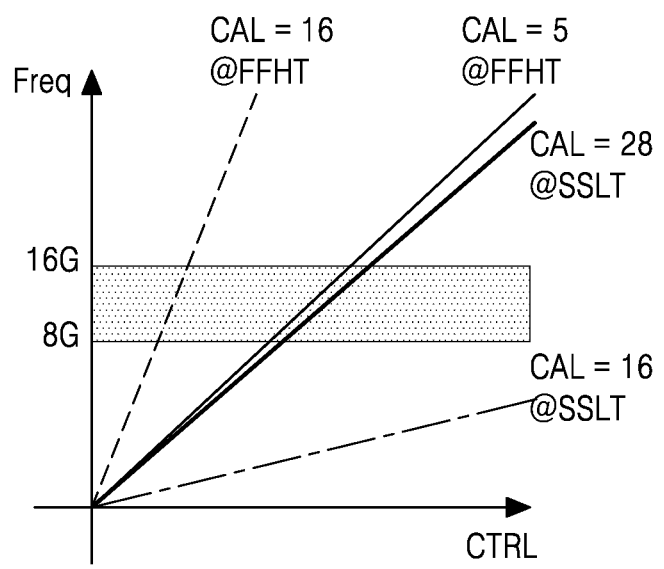
FIG. 9 is a graph illustrating the generation of clock signal frequencies by a PLL circuit according to embodiments of the inventive concept.

FIG. 9 is a graph illustrating clock signal frequencies that may be generated by a PLL circuit according to embodiments of the inventive concept.

Referring to FIG. 9, for the same calibration signal CAL, the frequencies of various oscillation signals provided by an oscillator may differ in accordance with PVT corner states. Hence, even when a same control voltage is received, an oscillation signal having a relatively high frequency may be output in a fast PVT corner, as compared with a slow PVT corner. For example, assuming a calibration signal CAL defined by a 5-bit code, the calibration signal CAL may have one of 32 possible levels (e.g., levels 0 to 31, inclusively). Thus, in a case wherein the oscillator provides an oscillation signal in response to a calibration signal CAL of level 16 (e.g., a relatively middle level), even when control voltages of same level are received, an output frequency within a target frequency range (e.g., 8 GHz to 16 GHz) may be generated in the fast PVT corner, but an output frequency of a lower frequency range may be generated in the slow PVT corner as compared to the fast PVT corner FFHT.

Alternately, a PLL circuit according to embodiments of the inventive concept may generate the calibration signal CAL corresponding to a high level in the slow PVT corner and generate the calibration signal CAL corresponding to a low level in the fast PVT corner. Thus, even when control voltages of same level are received, output frequencies within a target frequency range may be generated.

Referring to FIGS. 7A and 7B, for example, the PLL circuit may generate the calibration signal CAL corresponding to a level 5 in the fast PVT corner, and may generate the calibration signal CAL corresponding to a level 28 in the slow PVT corner. Here, a greater driving current may be needed to drive an oscillator in the slow PVT corner than in the fast PVT corner in order to compensate for an IR drop due to the greater driving current, wherein at least one load circuit associated with the PLL circuit may demand a higher driving voltage.

Figure 10:
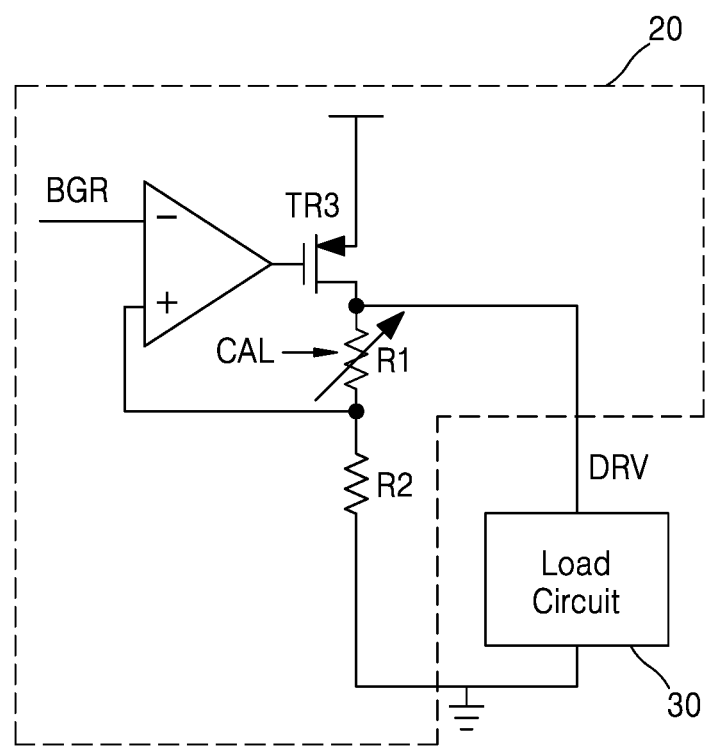
FIG. 10 is a block diagram illustrating a regulator and a load circuit in relation to a PLL circuit according to embodiments of the inventive concept.

FIG. 10 is a block diagram illustrating a regulator 20 and a load circuit 30 that may be associated with a phase locked loop (PLL) circuit according to embodiments of the inventive concept.

Referring to FIG. 10, the regulator 20 may include a comparator, a third transistor TR3, a first resistor R1 and a second resistor R2, wherein the first resistor R1 is a variable resistor having a resistance that varies in response to the applied calibration signal CAL. The comparator may compare a bandgap reference voltage BGR with a feedback voltage derived according to a ratio between the resistance of the first resistor R1 and the resistance of the second resistor R2 to generate a comparison result, wherein the activation/deactivation of the third transistor TR3 is controlled by the comparison result. That is, the regulator 20 may be controlled, such that a feedback voltage has the same level as that of the bandgap reference voltage BGR.

Here, a driving voltage DRV applied to the load circuit 30 may be determined in relation to the resistance of the first resistor R1 and the resistance of the second resistor R2, and the level of the driving voltage DRV may be as expressed as:

$$V_{DRV} = \frac{R1 + R2}{R2} \times V_{BGR}$$

Here, the level of the driving voltage DRV may be proportional to the resistance of the first resistor R1, may be inversely proportional to the resistance of the second resistor R2, and may be proportional to the level of the bandgap reference voltage BGR. When the level of the bandgap reference voltage BGR is constant, the level of the driving voltage DRV may be proportional to a resistance ratio between the first resistor R1 and the second resistor R2.

Referring to FIG. 10, the first resistor R1 may be a variable resistor having a resistance that varies in response to the applied calibration signal CAL. Thus, the level of the driving voltage DRV may be proportional to the level of the calibration signal CAL. However, the regulator 20 is not limited to only the illustrated embodiment including variable first resistor R1, wherein the driving voltage DRV is determined according to a ratio between the resistance of the first resistor R1 and the resistance of the second resistor R2, and wherein at least one of the resistance of the first resistor R1 and the resistance of the second resistor R2 varies.

In some embodiments, a PLL circuit according to embodiments of the inventive concept include a number of regulators 20, wherein each one of the regulators 20 respectively and independently provides a driving voltages DRV to a corresponding load circuit 30.

FIG. 11 is a table listing exemplary relationships between levels of a driving voltage DRV, respective calibration signal CAL levels 0 to 31 and corresponding R1/R@ resistance ratios.

Referring to FIG. 11. a resistance ratio R1/R2 between the first resistor R1 and the second resistor R2 may be set according to a level of the calibration signal CAL, and the regulator 20 may determine a level of the driving voltage DRV based on the resistance ratio R1/R2. For example, as the level of the calibration signal CAL increases, the level of the driving voltage DRV demanded by the load circuit 30 may increase. Here, the resistance of at least one of the first resistor R1 and the second resistor R2 of the regulator 20 may vary according to the calibration signal CAL set by the AFC circuit 10, and the driving voltage DRV generated according to a varied resistance ratio R1/R2 may be provided to the load circuit 30.

Figure 12:
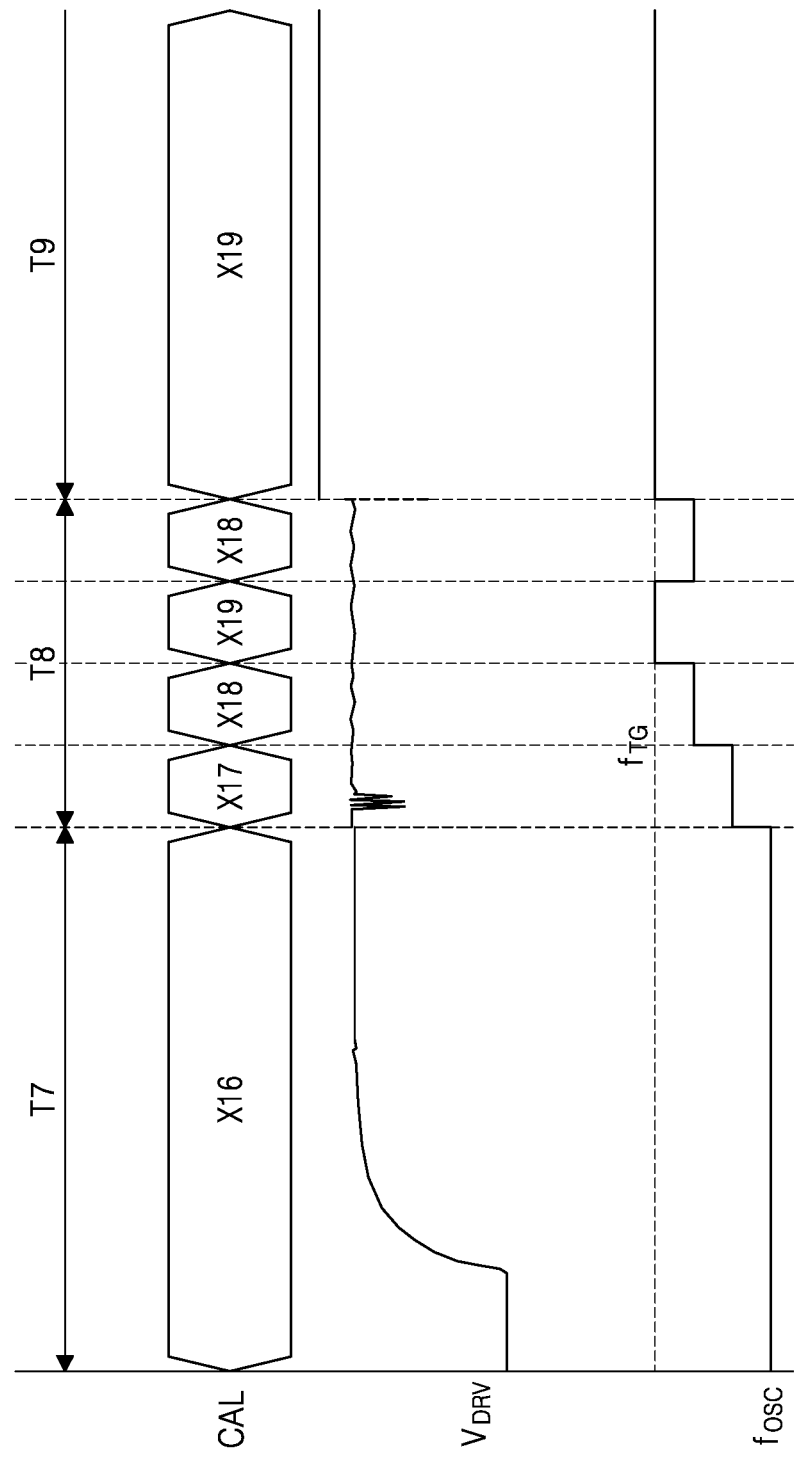
FIG. 12 is a timing diagram illustrating relationships between a driving voltage and a feedback frequency generated by a calibration signal according to embodiments of the inventive concept.

FIG. 12 is a timing diagram illustrating certain relationships among a driving voltage and a feedback frequency generated by the calibration signal CAL in relation to embodiments of the inventive concept.

Referring to FIG. 12, a PLL circuit may output a driving voltage $V_{DRV}$ and an oscillation signal based on an initially set calibration signal CAL during T7. The initially set calibration signal CAL may include, for example, code information corresponding to level 16, which is the middle value of possible levels for the calibration signal CAL. Here, at least one regulator 20 may generate the driving voltage $V_{DRV}$ corresponding to the initially set calibration signal CAL by incrementing the driving voltage $V_{DRV}$ until a stably generated driving voltage $V_{DRV}$ is provided.

During T8, the AFC circuit 10 may generate the calibration signal CAL based on a difference between the output frequency $f_{OSC}$ and the target frequency $f_{TG}$. For example, referring to FIG. 12, because the level of the output frequency $f_{OSC}$ is less than the level of the target frequency $f_{TG}$, the AFC circuit 10 may provide the calibration signal CAL corresponding to a greater level than a previous calibration signal CAL to an oscillator driving circuit to increase the output frequency $f_{OSC}$. The AFC circuit 10 may update the calibration signal CAL by periodically comparing the output frequency $f_{OSC}$ with the target frequency $f_{TG}$, such that the output frequency $f_{OSC}$ becomes close to the target frequency $f_{TG}$.

During period T9, the PLL circuit may provide the calibration signal CAL, as updated such that the output frequency $f_{OSC}$ becomes close to the target frequency $f_{TG}$, to the at least one regulator 20, and the at least one regulator 20 may generate an updated driving voltage $V_{DRV}$ based on the updated calibration signal CAL. Referring to FIG. 12, because the level of the calibration signal CAL updated during T9 is greater than the level of the calibration signal CAL during T7, the at least one regulator 20 may output the driving voltage $V_{DRV}$ of a higher level as compared to T7.

Consistent with the foregoing, PLL circuits according to embodiments of the inventive concept may adaptively adjust a driving voltage $V_{DRV}$ supplied to the load circuit 30 according to a PVT corner state and the target frequency $f_{TG}$, and the load circuit 30 may efficiently perform a phase-locking operation with minimal power consumption based on an adaptively adjusted driving voltage $V_{DRV}$.

While certain embodiments of the inventive concept have been particularly illustrated and described with reference to accompanying drawings, those skilled in the art will understand that changes in form and details may be made thereto without departing from the scope of the inventive concept, as defined by the following claims.

What is claimed is:

1. A phase locked loop (PLL) circuit, comprising:
  a load circuit that generates an output signal in response to a driving voltage;
  a frequency calibration circuit that generates a calibration signal in response to an output frequency of the output signal and a target frequency; and
  a regulator that generates the driving voltage in response to the calibration signal.

2. The PLL circuit of claim 1, wherein the calibration signal includes code information including at least one bit generated by comparing the output frequency and the target frequency.

3. The PLL circuit of claim 1, wherein the frequency calibration circuit generates the calibration signal with a lower driving voltage than a previously generated driving voltage when the target frequency is lower than the output frequency.

4. The PLL circuit of claim 1, wherein the regulator includes a variable resistor having a resistance that varies in response to the calibration signal, and
  the regulator generates the driving voltage in relation to a bandgap reference voltage determined by the resistance of the variable resistor.

5. The PLL circuit of claim 1, further comprising:
  a plurality of regulators including the regulator; and a plurality of load circuits including the load circuit,
wherein each of the plurality of regulators respectively provides a driving voltage to a corresponding one of the plurality of load circuits.

6. The PLL circuit of claim 1, further comprising:
a phase frequency detector that generates a detection signal by detecting a phase difference between a reference signal and a feedback signal derived from the output signal;
a charge pump that determines an electrical charge signal having a level and a direction in response to the detection signal;
a loop filter that generates a control voltage in response to the electrical charge signal;
an oscillator circuit that generates an oscillation signal in response to the control voltage and the calibration signal;
an oscillator buffer that generates the output signal in response to the oscillation signal;
a divider that divides a frequency of the output signal according to a division ratio; and
a transmission signal buffer that generates a transmission signal in response to the output signal.

7. The PLL circuit of claim 6, wherein the oscillator circuit including an oscillator that generates the oscillation signal and an oscillator driving circuit that generates a driving current applied to the oscillator in response to the control voltage and the calibration signal, such that the oscillation signal has a frequency proportional to a level of the driving current.

8. The PLL circuit of claim 7, further comprising:
a plurality of regulators including a first regulator, a second regulator and a third regulator; and
a plurality of load circuits including a calibration block including an automatic frequency calibration (AFC) circuit, the oscillator buffer and the transmission signal buffer,
wherein the first regulator provides a first driving voltage to the oscillator buffer,
the second regulator provides a second driving voltage to the transmission signal buffer, and
the third regulator provides a third driving voltage to the calibration block.

9. The PLL circuit of claim 7, wherein the oscillator driving circuit includes a current mirror that generates the driving current by amplifying a control current generated in response to the control voltage.

10. The PLL circuit of claim 9, wherein a level of the driving current is defined by multiplying a level of the control current by a weight corresponding to the calibration signal.

11. A method of operating a phased locked loop (PLL) circuit, the method comprising:
generating a driving voltage in a regular in response to a calibration signal;
generating an output signal having an output frequency in response to the driving voltage; and
generating the calibration signal by comparing the output frequency and a target frequency.

12. The method of claim 11, wherein the calibration signal includes code information including at least one bit generated by the comparing of the output frequency and the target frequency.

13. The method of claim 11, wherein the generating of the calibration signal comprises:
generating the calibration signal with a lower driving voltage than a previously generated driving voltage when the target frequency is lower than the output frequency.

14. The method of claim 11, wherein the generating of the driving voltage comprises:
determining a resistance for a variable resistor in the regulator in response to the calibration signal; and then,
determining a level of the driving voltage in relation to a bandgap reference voltage and the resistance of the variable resistor.

15. The method of claim 11, wherein the PLL circuit includes a plurality of regulators including the regulator and a plurality of load circuits, wherein each of the plurality of regulators respectively provides a driving voltage to a corresponding one of the plurality of load circuits.

16. The method of claim 11, wherein the generating of the calibration signal comprises:
generating a driving current applied to an oscillator, wherein the driving current is generated in response to the calibration signal;
generating an oscillation signal in the oscillator having a frequency proportional to a level of the driving current; and
updating the calibration signal in response to a comparison result generated by comparing a feedback frequency for a feedback signal derived from the output signal and a target frequency.

17. The method of claim 16, wherein the level of the driving current is defined by multiplying a level of a control current by a weight corresponding to the calibration signal.

18. A phase locked loop (PLL) circuit, comprising:
a load circuit driven by a driving voltage and generating an output signal having an output frequency; and
a regulator that generates the driving voltage, wherein a level of the driving voltage varies with a calibration signal, and the calibration signal is generated by comparing the output frequency with a target frequency,
wherein the regulator comprises:
a first resistor having a first resistance that varies with the calibration signal;
a second resistor having a second resistance;
a comparator that compares a bandgap reference voltage with a feedback voltage defined according to a ratio of the first resistance and the second resistance to generate a comparison result; and
a transistor activated in response to the comparison result.

19. The PLL circuit of claim 18, wherein the driving voltage is generated from the bandgap reference voltage according to a ratio between the first resistance and the second resistance.

20. The PLL circuit of claim 18, further comprising:
a plurality of regulators including the regulator; and
a plurality of load circuits including the load circuit,
wherein each of the plurality of regulators respectively provides a driving voltage to a corresponding one of the plurality of load circuits.

* * * * *